United States Patent [19]

Engelhardt

[11] Patent Number: 5,332,468
[45] Date of Patent: Jul. 26, 1994

[54] METHOD FOR STRUCTURING A LAYER USING A RING ELECTRODE AND MULTIPLE RF POWER SOURCES

[75] Inventor: Manfred Engelhardt, Feldkirchen-Westerham, Fed. Rep. of Germany

[73] Assignee: Siemens Aktiengesellschaft, Munich, Fed. Rep. of Germany

[21] Appl. No.: 953,937

[22] Filed: Sep. 30, 1992

[30] Foreign Application Priority Data

Oct. 23, 1991 [DE] Fed. Rep. of Germany ....... 4135033

[51] Int. Cl.$^5$ .................. H01L 21/00; H01L 21/306; B44C 1/22; C03C 15/00
[52] U.S. Cl. .................... 156/643; 437/225; 204/192.25; 204/192.3
[58] Field of Search ............. 437/225; 156/643; 204/192.23, 192.25, 192.3

[56] References Cited

U.S. PATENT DOCUMENTS 4,786,359 11/1988 Stark et al. ..................... 156/643

FOREIGN PATENT DOCUMENTS

WO86/03886 7/1986 PCT Int'l Appl. .

OTHER PUBLICATIONS

"Enhancement Of Selectivity In A Polysilicon Tride Etch Process Using Independent Bias Voltage Control In Conjunction With $Br_2$ and $Cl_2$ Plasmas" by S. Davis et al, 10440 Proceedings of the Electrochemical Society (1989) No. 9, New York, pp. 486–497.
"Triode Plasma Etching" by V. J. Minkiewicz et al, Applied Physics Ltrs. vol. 34, No. 1, Feb. 1, 1979, pp. 192-193.
"Extremely high selective, highly anisotropic, & high rate electron cyclotron resonance plasma etching for n+poly-Si at the electron cyclotron resonance position", by Seiji Samukawa, 1990, J. Vac. Sci. Technology B 8 (6), Nov./Dec. 1990, pp. 1192-1198.

Primary Examiner—R. Bruce Breneman
Assistant Examiner—B. Everhart
Attorney, Agent, or Firm—Hill, Steadman & Simpson

[57] ABSTRACT

Method for structuring a layer. For structuring a layer that is arranged on a lower layer of a different material using a plasma etching process, a target (14) of the material of the lower layer is arranged in an etching reactor (1). The etching process is managed such that material is sputtered from the target (14) and is deposited on surfaces of the lower layer exposed in the etching process to essentially the same degree to which the lower layer is eroded by the etching process. The method is particularly suited for structuring a polysilicon layer that is arranged on a gate oxide layer.

19 Claims, 1 Drawing Sheet

METHOD FOR STRUCTURING A LAYER USING A RING ELECTRODE AND MULTIPLE RF POWER SOURCES

BACKGROUND OF THE INVENTION

Plasma-assisted etching processes are often used in semiconductor technology for manufacturing LSI circuits in order to produce fine structures. To that end, an etching mask is arranged on a layer to be structured. The structures of the etching mask are to be transferred into the layer to be structured with dimensional accuracy in the anisotropic etching process. A lower layer arranged under the layer to be structured should remain optimally unaffected by the etching process. In addition to the requirement of high anisotropy, a requirement of high selectivity relative to the lower layer is also necessary for the etching process.

This problem is especially serious when the layer to be structured is arranged on an uneven surface. This is usually unavoidable in the manufacture of integrated circuits. In particular, this is the case when structuring a polysilicon layer that is arranged on a thin $SiO_2$ layer. This example occurs in the manufacture of polysilicon gate electrodes on a gate oxide layer produced surface-wide in the manufacture of logic or memory circuits.

When the surface on which the layer to be structured has vertical side walls, then side wall coverings, referred to as spacers, are formed at these vertical side walls in the anisotropic etching process. The etching process must be continued in order to remove these, even when the lower layer is already uncovered to a great extent. This procedure is referred to as "over-etching". A high selectivity of the etching is required so that the lower layer is thereby not attacked.

It is especially important in the example of a polysilicon layer to be structured on a lower layer composed of $SiO_2$ for producing a gate electrode to completely remove the side wall coverings, since these would lead to shorts in the finished surface structure.

An article by S. Samukawa et al. (J. Vac. Sci. Technol. B8(6) page 1192, November/December 1990) discloses that the selectivity of an etching process for structuring polysilicon relative to $SiO_2$ be increased by adding $O_2$ as an additional process gas to the $Cl_2$ process gas.

Another possibility is to modify the process chemistry, for example by replacing the chlorine chemistry with a bromine chemistry.

Only a finite increase in the selectivity, however, can be fundamentally achieved with these measures, so that the lower layer must always have a minimum thickness in order to withstand the over-etching during the removal of the side wall coverings. The thickness of the lower layer defines the maximum duration of the over-etching.

SUMMARY OF THE INVENTION

The present invention is based on the problem of providing a method for structuring a layer wherein a lower layer arranged under the layer to be structured in an etching process that is protected against the etching attack.

This problem is inventively resolved with a method for structuring a layer having the following steps. An anisotropic plasma etching process is implemented in an etching reactor with at least one wafer holder and a ring electrode that annularly surrounds the wafer holder. Two RF powers of different frequencies are supplied independently of one another via the wafer holder and via the ring electrode. A substrate having a layer structure that contains at least one lower layer composed of a material different from the material of the layer to be structured and that contains the layer to be structured is introduced into the etching reactor. A target that contains the material of the lower layer is provided in the etching reactor. The RF power at the ring electrode is set such that the material is sputtered from the target and such that it deposits on surfaces of the lower layer that are exposed during the etching process to essentially the same degree to which the lower layer is attacked by the etching process.

The method of the present invention utilizes the fact that, dependent on the selection of the process parameters, plasmas are employed both for etching as well as for depositing layers in what is referred to as sputtering methods. The method of the present invention is implemented in an etching reactor wherein a RF power having a first frequency is applied via the wafer holder and, independently thereof, a RF power of a second high frequency is applied via a ring electrode. The ion energy and, thus, the etching process is controlled via the wafer holder. The ion density is set via the ring electrode. What is achieved by setting a high ion density of the particle type of the material of the lower layer is that these particles frequently suffer impacts. As a consequence thereof, these particles have only low energy and do not contribute to the etching process. These particles deposit on exposed surfaces of the lower layer, since they are composed of the same material and thus serve as nucleus for the layer formation.

The RF power supplied at the ring electrode is set such that the layer growth on the exposed surfaces of the lower layer essentially corresponds to the etching attack of the etching process at these surfaces. In this way, the thickness of the lower layer does not change in the final outcome. As a result the etching process can be continued for an arbitrarily long time when structuring the layer of a given material when the surface of the lower layer is exposed. The selectivity of the etching is effectively improved in this way.

High anisotropies are also achieved at low gas pressures by using an etching reactor having permanent magnets for enclosing the plasma. Over and above this, it is possible to ignite a stable plasma in such an etching reactor at low gas pressures using only $Cl_2$, $Br_2$ or a $Cl_2/Br_2$ mixture. Low gas pressures in this context are pressures below 10 mTorr (1.3 Pa).

It particularly lies within the framework of the present invention to use an etching reactor wherein a grounded electrode is arranged opposite the wafer holder and wherein the ring electrode and the grounded electrode are provided with permanent magnets. A gas pressure below 10 mTorr (1.3 Pa) is thereby set in the etching reactor. A RF power having a frequency of 13.56 MHz is applied to the ring electrode and a RF power having a frequency of 100 kHz is applied via the wafer holder.

The method can be advantageously used for manufacturing a gate electrode of polysilicon. In this case, the layer to be structured is composed of polysilicon and the lower layer is composed of $SiO_2$. The lower layer is then the gate oxide layer that typically has a thickness of 10 through 20 nm. Since the gate oxide layer is arranged directly on a single-crystal silicon-substrate, it is especially important that this gate oxide layer not be destroyed during the anisotropic etching process. The gate oxide layer is intended to protect the surface of the single-crystal silicon substrate against the attack of the etching process.

It lies within the framework of the present invention to use as a target the quartz lining of the etching reactor when structuring the layer of polysilicon on a lower layer of $SiO_2$. The lining thereby covers at least the ring electrode and the grounded electrode. The lining has openings for gas admission. In addition to its role as a target, the lining of quartz has the effect that the plasma excited in the etching process does not come into direct contact with the ring electrode or with the grounded electrode. An erosion of the electrodes during operation is thus avoided. Since in practice the electrodes are coated with $Al_2O_3$, such an erosion leads to metal contamination of the substrate. The employment of a quartz covering on the electrodes has the advantage of avoiding such contamination.

One advantage of the covering of quartz on the ring electrode is that the deposition of $SiO_2$ on the exposed surfaces of the lower layer occurs especially uniformly since the quartz covering annularly surrounds the substrate.

Further developments of the invention are as follows. The 100 kHz RF power is set in the range from 10 through 50 Watts, the 13.56 MHz RF power is set in the range from 900 through 1200 Watts, the throughput of the etching gas is set in the range from 15 through 25 sccm and the gas pressure is set in the range from 1 through 5 mTorr (0.13 through 0.65 Pa). The method can be used for producing at least one gate electrode that contains polysilicon and for structuring a polysilicon layer in a DRAM process.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

DESCRIPTION OF THE PREFERRED EMBODIMENT

Figure 1:
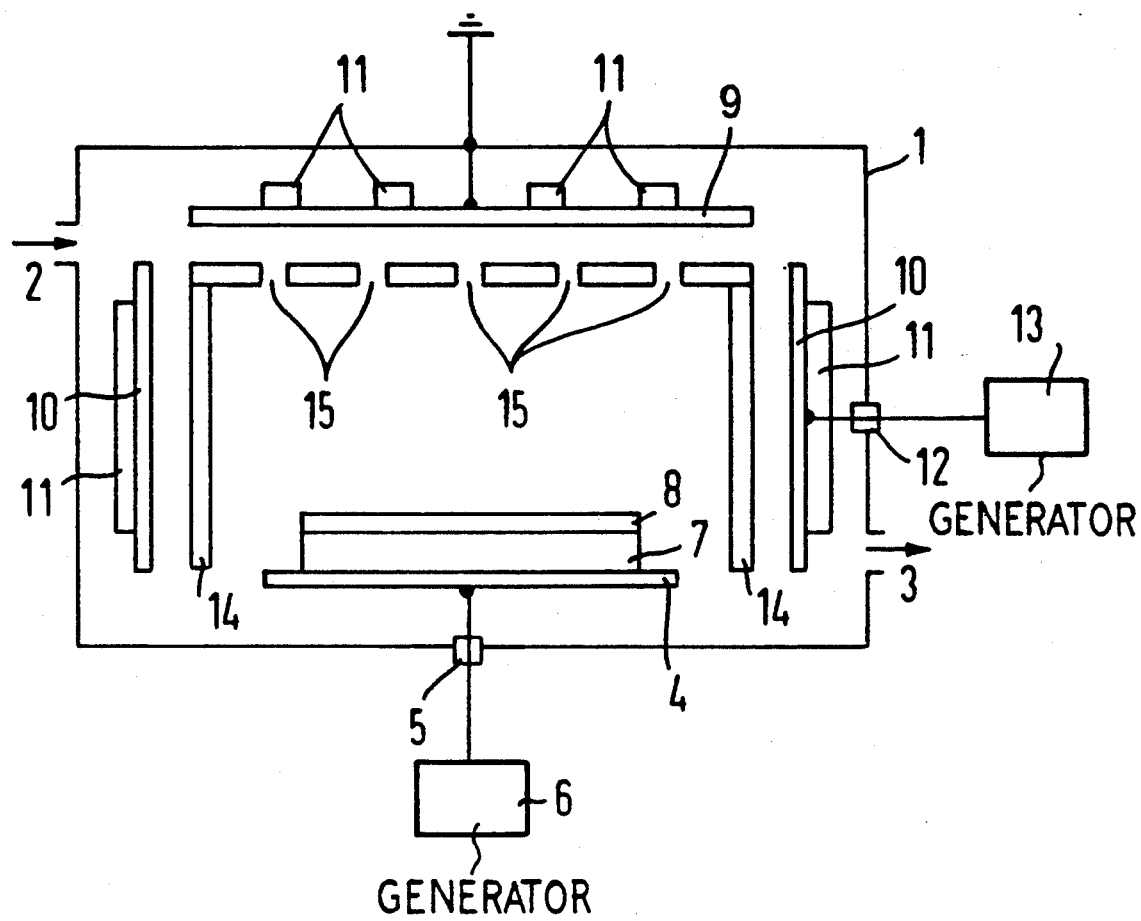
FIG. 1 shows an etching reactor that is suitable for the method of the present invention.

As depicted in FIG. 1, the etching reactor has an etching chamber 1 that is grounded. The etching chamber 1 is provided with a gas inlet 2 and a gas outlet 3.

A wafer holder 4 is arranged in the etching chamber 1. The wafer holder 4 is connected to a 100 kHz generator 6 via a lead-through 5. A substrate 7 is arranged on the wafer holder 4. A layer structure 8 is arranged on the substrate 7. The layer structure 8 has a lower layer that is arranged directly on the substrate 7 and that, for example, is composed of $SiO_2$. A layer of, for example, polysilicon that is to be structured is arranged on the lower layer. An etching mask is arranged on the layer to be structured.

A grounded electrode 9 is arranged in the etching chamber 1 opposite the wafer holder 4. Further, a ring electrode 10 is arranged in the etching chamber 1. The ring electrode 10 annularly surrounds the space between the electrode 9 and the wafer holder 4. The ring electrode 10 and the electrode 9 are provided with permanent magnets 11. The ring electrode 10 is connected to a 13.56 MHz generator 13 via a lead-through 12.

Finally, a quartz covering 14 is arranged in the etching chamber 1. The quartz covering is situated between the ring electrode 10 and the substrate 7 as well as between the electrode 9 and the substrate 7. The quartz covering 14 prevents direct contact between a plasma generated during operation and the ring electrode 10 as well as the electrode 9. Openings 15 in order to assure the gas flow through the etching chamber 1 are provided in the quartz covering 14.

The quartz covering 14 acts as a target in the etching chamber 1. During operation of the etching chamber 1, i.e. when the 13.56 MHz generator 13 is activated and the 100 kHz generator 6 is activated, a sputter erosion of the quartz covering 14 occurs.

The RF powers of the 13.56 MHz generator 3 and the 100 kHz generator 6 can be set independently of one another. An increase in the 13.56 MHz RF power results in an increase of the sputter erosion in the quartz covering 14. This results in an increased deposit of $SiO_2$ on exposed surfaces of the lower layer in the layer structure 8 on the substrate 7 A decrease in the 100 kHz RF power, by contrast, leads to a reduction of the etching attack at the layer structure arranged on the substrate 7 The 13.56 MHz RF power and the 100 kHz RF power are thus set such that the deposition of $SiO_2$ and the etching attack on $SiO_2$ at the substrate balance one another.

The polysilicon layer to be structured on the lower layer of $SiO_2$ can, for example, be etched using the following process parameters:

The 13.56 MHz. RF power is set to 1000 Watts. Pure $Cl_2$ is used as the etching gas and is conducted through the chamber with a throughput of 20 sccm. The pressure in the etching chamber is 2 mTorr (0.26 Pa). In a first step, the 100 kHz RF power is set to 50 Watts. The etching process is carried out for 10 seconds at this power level. In this first step, what is referred to as the deposit oxide, a thin $SiO_2$ layer that is always found at the surface of silicon, is removed. The 100 kHz RF power is set to 30 Watts in a second step. The etching is implemented, for example, for 60 seconds at this power level in order to etch, for example, a 200 nm thick layer of polysilicon. Horizontal parts of the layer of polysilicon to be structured are thereby completely removed. The surface of the lower layer is exposed under these formerly horizontal parts of the polysilicon layer. In a third step, etching residues of polysilicon at steps are removed by overetching. To that end, the 100 kHz power is set to 15 Watts. The third step is implemented for 90 through 120 seconds. The required duration is dependent on the topology of the type of structure on the substrate. The exposed regions of the lower layer exhibit no etching attack after this etching time. Experiments have shown that the lower layer of $SiO_2$ remains unaltered in thickness even after 480 seconds of overetching.

The described exemplary embodiment can also be implemented with the same process parameters using pure $Br_2$ or of a mixture $Cl_2/Br_2$.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for structuring a layer, comprising the steps of:

implementing an anisotropic plasma etching process in an etching reactor having at least one wafer holder and a ring electrode that annularly surrounds the wafer holder, two RF power sources of different frequencies being supplied independently of one another via the wafer holder and via the ring electrode, respectively;

introducing into the etching reactor a substrate having a layered structure that contains at least one lower layer composed of a first material different from a second material of the layer to be structured and that contains the layer to be structured;

providing a target that contains the first material of the lower layer in the etching reactor;

setting the RF power at the ring electrode such that the first material is sputtered from the target and such that the first material deposits on surfaces of the lower layer that are exposed during the etching process to substantially the same degree to which the lower layer is attacked by the etching process.

2. The method according to claim 1, wherein an etching mask is arranged on the layer to be structured.

3. The method according to claim 1, wherein a grounded electrode is arranged in the etching reactor opposite the wafer holder, wherein permanent magnets are arranged at the ring electrode and at the grounded electrode, and wherein a gas pressure below 10 mTorr is set in the etching reactor.

4. The method according to claim 3, wherein a RF power having a frequency of 13.56 MHz is applied via the ring electrode and RF power having a frequency of 100 kHz is applied via the wafer holder.

5. The method according to claim 3, wherein the layer to be structured is composed of polysilicon and wherein the lower layer is composed of $SiO_2$.

6. The method according to claim 5, wherein a quartz lining of the etching reactor is used as a target, said lining at least covering the ring electrode and the grounded electrode and having openings for gas admission.

7. The method according to claim 5, wherein an etching gas used in the etching process is at least one of the gases $Cl_2$, $Br_2$ and a mixture of $Cl_2$ and $Br_2$.

8. The method according to claim 7, wherein the 100 kHz RF power is set in the range from 10 through 50 Watts, the 13.56 MHz RF power is set in the range from 900 through 1200 Watts, a throughput in the etching reactor of the etching gas is set in the range from 15 through 25 sccm and gas pressure of the etching gas is set in the range from 1 through 5 mTorr.

9. A method for structuring a layer, comprising the steps of:

providing an etching reactor having at least one wafer holder and a ring electrode that annularly surrounds the wafer holder;

implementing an anisotropic plasma etching process in the etching reactor;

supplying two RF power sources of different frequencies independently of one another via the wafer holder and via the ring electrode, respectfully;

providing an etching gas in the etching chamber;

introducing into the etching reactor a substrate having a layered structure that contains at lest one lower layer composed of a first material different from a second material of the layer to be structured and that contains the layer to be structured;

providing a target that contains the first material of the lower layer in the etching reactor;

setting the RF power at the ring electrode such that the first material is sputtered from the target and such that the first material deposits on surfaces of the lower layer that are exposed during the etching process to substantially the same degree to which the lower layer is attacked by the etching process.

10. The method according to claim 9, wherein an etching mask is arranged on the layer to be structured.

11. The method according to claim 9, wherein a grounded electrode is arranged in the etching reactor opposite the wafer holder, wherein permanent magnets are arranged at the ring electrode and at the grounded electrode, and wherein the gas pressure is set below 10 mTorr in the etching reactor.

12. The method according to claim 11, wherein a RF power having a frequency of 13.56 MHz is applied via the ring electrode and RF power having a frequency of 100 kHz is applied via the wafer holder.

13. The method according to claim 11, wherein the layer to be structured is composed of polysilicon and wherein the lower layer is composed of $SiO_2$.

14. The method according to claim 13, wherein a quartz lining of the etching reactor is used as a target, said lining at least covering the ring electrode and the grounded electrode and having openings for gas admission.

15. The method according to claim 13, wherein the etching gas is at least one of the gases $Cl_2$, $Br_2$ and a mixture of $Cl_2$ and $Br_2$.

16. The method according to claim 15, wherein the 100 kHz RF power is set in the range from 10 through 50 Watts, the 13.56 MHz RF power is set in the range from 900 through 1200 Watts, a throughput in the etching reactor of the etching gas is set in the range from 15 through 25 sccm and gas pressure of the etching gas is set in the range from 1 through 5 mTorr.

17. A method for structuring a polysilicon layer on a lower layer of $SiO_2$, comprising the steps of:

providing an etching reactor having at least one wafer holder and a ring electrode that annularly surrounds the wafer holder; supplying two RF power sources of different frequencies independently of one another via the wafer holder and via the ring electrode, respectfully;

providing an etching gas of $Cl_2$ in the etching reactor at a pressure of approximately 2 mTorr and at a throughput of 20 sccm;

introducing into the etching reactor a substrate having a layered structure that contains at least a lower layer composed of $SiO_2$ and that contains the layer to be structured;

providing a target that contains $SiO_2$ in the etching reactor;

setting RF power to the ring electrode at approximately 1000 Watts at a frequency of approximately 13.56 MHz;

setting RF power to the wafer holder at approximate 50 Watts at a frequency of approximately 100 kHz for approximately 10 seconds to remove a thin $SiO_2$ layer;

resetting the RF power to the wafer holder at approximately 30 Watts for approximately 60 seconds to etch the polysilicon layer; and resetting the RF power to the wafer holder to approximately 15 Watts for approximately 90 to 120 seconds to remove etching residue of polysilicon by over-etching;

wherein the RF power at the ring electrode is set such that the $SiO_2$ is sputtered from the target and such that the $SiO_2$ deposits on surfaces of the lower layer that are exposed during the etching process to substantially the same degree to which the lower layer is attacked by the etching process.

18. The method according to claim 17, wherein a grounded electrode is arranged in the etching reactor opposite the wafer holder and wherein permanent magnets are arranged at the ring electrode and at the grounded electrode.

19. The method according to claim 17, wherein a quartz lining of the etching reactor is used as the target, said lining at least covering the ring electrode and the grounded electrode and having openings for gas admission.

* * * * *